US012600121B2

(12) United States Patent
Lorenz et al.

(10) Patent No.: US 12,600,121 B2
(45) Date of Patent: Apr. 14, 2026

(54) PRINTING STENCIL AND PRINTING DEVICES FOR FORMING CONDUCTOR PATHS ON A SUBSTRATE AND METHOD FOR PRODUCING A METAL CONTACT STRUCTURE OF A PHOTOVOLTAIC CELL

(71) Applicants: Fraunhofer-Gesellschaft zur Förderung der angewandten Forschung e.V., Munich (DE); LPKF Laser & Electronics SE, Garbsen (DE)

(72) Inventors: Andreas Lorenz, Freiburg (DE); Sebastian Tepner, Freiburg (DE); Kiarash Karimi, Freiburg (DE); Timo Wenzel, Freiburg (DE); Michael Linse, Freiburg (DE); Florian Clement, Freiburg (DE); Aaron Michael Vogt, Garbsen (DE)

(73) Assignees: Fraunhofer-Gesellschaft zur Förderung der angewandten Forschung e.V., Munich (DE); LPKF Laser & Electronics SE, Garbsen (DE)

( * ) Notice: Subject to any disclaimer, the term of this patent is extended or adjusted under 35 U.S.C. 154(b) by 0 days.

(21) Appl. No.: 18/850,678

(22) PCT Filed: Mar. 21, 2023

(86) PCT No.: PCT/EP2023/057147
§ 371 (c)(1),
(2) Date: Sep. 25, 2024

(87) PCT Pub. No.: WO2023/180285
PCT Pub. Date: Sep. 28, 2023

(65) Prior Publication Data
US 2025/0222688 A1      Jul. 10, 2025

(30) Foreign Application Priority Data
Mar. 25, 2022    (DE) .......................... 102022107163.4

(51) Int. Cl.
*B41F 15/36* (2006.01)
*B41F 15/08* (2006.01)
(Continued)

(52) U.S. Cl.
CPC .......... *B41F 15/36* (2013.01); *B41F 15/0818* (2013.01); *B41M 1/12* (2013.01);
(Continued)

(58) Field of Classification Search
None
See application file for complete search history.

(56) References Cited

U.S. PATENT DOCUMENTS 6,095,041 A     8/2000  Comino et al.

FOREIGN PATENT DOCUMENTS

DE          10104726 A1     8/2002
DE          69715254        10/2002
(Continued)

*Primary Examiner* — Joshua D Zimmerman
(74) *Attorney, Agent, or Firm* — Volpe Koenig

(57)        ABSTRACT

A printing stencil (1) for forming conductor tracks on a substrate. The printing stencil (1) has a plurality of cutouts in the form of printing gaps (4) for forming the conductor tracks. Each printing gap (4) of the plurality of printing gaps (4) has at least one print definition region (3) adjacent to the printing side and at least one printing medium supply region (2) adjacent to the squeegee side, the volume of the print definition region (3) being smaller than the volume of the printing medium supply region. Moreover, a printing device for forming conductor tracks on a substrate and a method for producing a metallic contact structure of a photovoltaic solar cell are also provided.

16 Claims, 2 Drawing Sheets

(51) Int. Cl.

| | |
|---|---|
| *B41M 1/12* | (2006.01) |
| *B41M 1/26* | (2006.01) |
| *B41N 1/24* | (2006.01) |
| *H10F 71/00* | (2025.01) |
| *H10F 77/00* | (2025.01) |

(52) U.S. Cl.
CPC ............... *B41M 1/26* (2013.01); *B41N 1/248* (2013.01); *H10F 71/00* (2025.01); *H10F 77/935* (2025.01)

(56) References Cited

FOREIGN PATENT DOCUMENTS

| | | | |
|---|---|---|---|
| DE | 102009054764 | A1 | 6/2011 |
| DE | 102019122126 | A1 | 2/2021 |
| EP | 3666524 | B1 | 4/2021 |
| WO | 2010142272 | A2 | 12/2010 |
| WO | 2018162385 | A1 | 9/2018 |

PRINTING STENCIL AND PRINTING DEVICES FOR FORMING CONDUCTOR PATHS ON A SUBSTRATE AND METHOD FOR PRODUCING A METAL CONTACT STRUCTURE OF A PHOTOVOLTAIC CELL

CROSS-REFERENCE TO RELATED APPLICATIONS

This application is a 371 National Phase of PCT/EP2023/057147, filed Mar. 21, 2023, which claims priority from German Patent Application No. 10 2022 107 163.4, filed Mar. 25, 2022, both of which are incorporated herein by reference as if fully set forth.

TECHNICAL FIELD

The invention relates to a printing stencil for forming conductor tracks on a substrate, to a printing device for forming conductor tracks on a substrate, and to a method for producing a metallic contact structure of a photovoltaic solar cell.

BACKGROUND

To apply a printing medium, in particular a screen printing paste, to a substrate, it is known practice to force the printing medium through a screen printing plate by means of a squeegee in order to apply the printing medium to the substrate. Typical screen printing plates have a screen printing fabric with a multiplicity of elongate fabric elements, with the screen printing fabric being permeable to the printing medium. In order to bring about structuring of the printing medium passing through the screen printing plate, a printing stencil is arranged on the screen printing fabric and said printing stencil has openings such that the printing medium passes through the screen printing plate only in the region of the printing stencil openings, and hence a structure of printing medium specified by the printing stencil openings can be applied to the substrate.

In the case of semiconductor components, and photovoltaic solar cells in particular, it is desirable to create narrow, straight-line structures of the printing medium on the substrate, especially in order to form narrow, straight-line metallic contacting elements, so-called contacting fingers. In order to keep shadowing vis-à-vis the incident light low, it is desirable to form particularly narrow straight-line structures. There thus exists the need to avoid variations in the cross-sectional area of the structures during the material application since a reducing cross section results in efficiency losses on account of an increased line resistance.

A screen printing plate for forming narrow, straight-line structures is known from DE 10 2019 122 126 A1.

There is the need to further optimize the printing plates, in order firstly to form narrow, straight-line structures of printing medium on the substrate and secondly to provide a stable printing plate which enables a high throughput during manufacturing operation but nevertheless is very durable and hence has a long working life.

SUMMARY

This object is achieved by a printing stencil for forming conductor tracks on a substrate, by a printing device for forming conductor tracks on a substrate, and by a method for producing a metallic contact structure of a photovoltaic solar cell, each having one or more of the features described herein. Advantageous configurations are found in the description and claims that follow.

The present invention is based on the insight that the use of a printing stencil embodied as a planar printing stencil is advantageous. However, forming the printing stencil with a sufficient thickness is desirable from the point of view of obtaining sufficient stability. However, this results in the disadvantage that the thickness of the printing gaps in the printing stencil also increases in accordance with the thickness of the planar printing stencil. This may lead to disadvantages when supplying the printing medium and/or when uniformly applying the printing medium to the substrate. According to the invention, these disadvantages are avoided by virtue of the printing gaps having a printing medium supply region and a print definition region.

The printing stencil according to the invention for forming conductor tracks on a substrate has a plurality of cutouts in the form of printing gaps for forming the conductor tracks on the substrate.

What is essential here is that the printing stencil is formed as a planar printing stencil. The printing stencil comprises a substrate side and a squeegee side opposite the substrate side. Each printing gap of the plurality of printing gaps has at least one print definition region adjacent to the printing side and at least one printing medium supply region adjacent to the squeegee side, the volume of the print definition region being smaller than the volume of the printing medium supply region. The printing medium supply region has an increasing gap width, preferably a strictly monotonically increasing gap width, in the direction of the squeegee side.

It is moreover essential that the walls of the print definition region form a first opening angle which is smaller than a second opening angle formed by the walls of the printing medium supply region and/or that the print definition region has an increasing gap width, preferably a strictly monotonically increasing gap width, in the direction of the substrate side.

The printing stencil according to the invention enables the formation of structures made of printing medium on the substrate as a result of the printing gaps. A printing medium is applied in the shape defined by the print definition region as a result of the print definition region. An application of structures with small dimensions requires narrow printing gaps appropriate to these dimensions.

The printing gaps have perpendicular side walls in printing plates used within the scope of state-of-the-art screen printing. Should these printing gap dimensions be small and the printing gaps thus have a small width in the case of already known printing plates, then this gives rise to the problem that the printing medium cannot be fed in sufficient quantities. The printing stencils according to the prior art are manufactured to be as thin as possible to counteract this problem. However, thin printing stencils lead to reduced durability, and they therefore must be replaced frequently during manufacturing operation and/or require support structures, e.g. a screen printing fabric, on which the printing stencil is arranged.

In the printing stencil according to the invention, the printing medium supply region has a greater volume than the print definition region. This allows the use of printing stencils with a greater thickness, and hence stability, vis-à-vis the prior art since an increased flow of printing medium to the printing medium definition region is rendered possible on account of the larger volume of the printing medium supply region. On account of the greater stability, the printing stencil according to the invention can consequently also manage without supporting structures in the region of the printing gaps, in particular manage without a screen printing fabric.

The printing medium supply region of the printing stencil according to the invention has an increasing gap width, preferably a strictly monotonically increasing gap width, in the direction of the squeegee side. This promotes the supply of printing medium on the squeegee side.

A further advantage of the printing stencil according to the invention is that the increasing gap width prevents a deposition of the printing medium.

The printing stencil according to the invention is particularly suited to forming metallic contacting structures of a photovoltaic solar cell. Such contacting structures, especially the contacting fingers of such solar cells, typically have a straight-line embodiment. Thus, the printing gaps of the plurality of printing gaps are advantageously formed as straight-line printing gaps.

The scope of the invention includes the case of a first opening angle formed by the walls of the print definition region and a second opening angle formed by the walls of the printing medium supply region having the same orientation. In this case, the print definition region also has an increasing gap width, preferably a strictly monotonically increasing gap width, in the direction of the squeegee side. However, the first opening angle is smaller than the second opening angle in this case, in order to enable a large volume in the printing medium supply region and a precise definition of the narrow print structures in the print definition region.

In an advantageous embodiment, the printing stencil therefore comprises a print definition region, the opening angle of which is smaller than that of the printing medium supply region; in particular, the print definition region opening angle is smaller by 10°, preferably by 20°, and in particular by 30°.

The scope of the invention also includes the case of the first opening angle having an opposite orientation to the second opening angle. In this advantageous embodiment, the print definition region has an increasing gap width, preferably a strictly monotonically increasing gap width, in the direction of the substrate side. This also enables a precise definition of the structure to be printed.

Advantageously, the opening angle of the print definition region is greater than 30°, preferably greater than 40°, and particularly preferably greater than 60° in this case.

Considered advantageous in the case of this embodiment is the fact that this promotes firstly a high inflow of printing medium in the printing medium supply region and secondly a precise definition of the structure to be printed.

An advantageous configuration arises in an embodiment wherein the printing stencil has a thickness of greater than 50 μm, in particular greater than 100 μm, and preferably greater than 500 μm.

An advantage of this configuration lies in the stability which increases with the stencil thickness.

An advantageous configuration arises in an embodiment wherein the print definition region has a thickness of less than 250 μm, in particular less than 50 μm, and preferably less than 25 μm.

An advantage of this configuration is that it is consequently possible to obtain the targeted height of the structure formed of printing medium of less than 250 μm, in particular less than 50 μm, and preferably less than 25 μm.

An advantageous configuration arises in an embodiment wherein the stencil body is formed of one of the materials of glass, silicon, and stainless steel, and preferably formed of glass. The advantages of using the aforementioned materials, in particular of using glass, in contrast to the conventional materials lie in the fact that glass has an increased scratch resistance. Moreover, glass has a high Young's modulus and moreover a smaller thermal expansion.

An advantageous configuration arises in an embodiment wherein the width of each printing gap of the plurality of printing gaps is less than 50 μm, in particular less than 25 μm, and preferably less than 15 μm at the end of the print definition region nearest to the squeegee side.

An advantage of this embodiment is that the flow behavior of the printing medium is consequently influenced significantly, whereby the geometry of the printed structures has a high homogeneity.

A further advantageous configuration arises in an embodiment wherein the width of each printing gap of the plurality of printing gaps is less than 50 μm, in particular less than 25 μm, preferably less than 15 μm, and/or in the range of 15 μm to 25 μm at the end of the print definition region nearest to the substrate side.

An advantage of this embodiment is that the flow behavior of the printing medium is consequently influenced significantly, whereby the geometry of the printed structures has a high homogeneity.

A further advantageous configuration arises in an embodiment wherein the width of each printing gap of the plurality of printing gaps is greater than 15 μm, in particular greater than 25 μm, and preferably greater than 50 μm at the end of the printing medium supply region nearest to the squeegee side.

An advantage of this embodiment is that a sufficient amount of printing medium is consequently supplied. The width of the printing gap at the end nearest to the squeegee side is moreover decisive for the volume that forms in the printing medium supply region. This volume represents a printing medium reservoir, from which the medium feed is fed.

A further advantageous configuration arises in an embodiment wherein the printing medium supply region terminates directly at the squeegee side, and the print definition region terminates directly at the substrate side, in particular wherein the printing medium supply region and print definition region are adjacent to one another.

A further advantageous configuration arises in an embodiment wherein the print definition region tapers in the direction of the squeegee side, and the printing medium supply region opens in the direction of the squeegee side.

An advantage of this embodiment whose profile is similar to that of an hourglass is that this configuration forms an open volume facing the substrate. This volume allows the uptake of printing medium through the printing medium feed and the application of printing medium to the substrate in greater quantities than in the case of the aforementioned exemplary embodiments.

A further object of the invention lies in proposing a printing plate, a printing device and a method for forming conductor tracks on a substrate.

A printing plate according to the invention comprises a printing stencil according to the invention, the printing stencil being arranged in a frame, preferably under tensile stress.

The advantage of attachment in a frame is that the clamped printing stencil is stable on account of the tensile stress but nevertheless arranged on the frame with a little flexibility.

An advantageous configuration of a printing plate according to the invention arises in an embodiment wherein no carrier structures, in particular no weblike carrier structures, are formed on the openings of the printing gaps, and in particular no screen printing fabric is arranged there.

In conventional screen printing plates, a carrier material, in particular a web-like carrier material with a mesh, is arranged over the entire area of the stencil. However, a disadvantage especially in the case of a screen fabric is that a carrier material must be used in the case of very small structures and said carrier material has wires with a diameter substantially smaller than the structure to be printed. These carrier materials lead to a lower stability and poorer dimensional stability of the printing stencil. The described disadvantages are overcome by omitting the carrier structure when using the planar printing stencil. This embodiment can manage without a carrier material since the stability of the printing stencil need not be obtained by way of web-like carrier structures since, as explained above, the printing stencil can be embodied with a thickness that is sufficient for the inherent stability of the printing stencil.

The printing medium, especially a screen printing paste, is applied to a substrate by way of a printing device according to the invention, wherein the printing device comprises a printing stencil according to the invention, in particular a preferred embodiment thereof, and at least one squeegee. The squeegee is used to apply the printing medium onto the substrate through the printing plate.

By way of the printing gaps in the printing stencil, the printing device according to the invention enables the formation of structures, especially straightline structures made of printing medium, on the substrate using a very durable printing stencil.

The method according to the invention for producing a metallic contact structure of a photovoltaic solar cell comprises the following method steps:

applying printing medium to a squeegee side of a printing stencil, printing the printing medium through printing gaps in the printing stencil by means of at least one squeegee in order to apply a printing medium structure to a solar cell substrate on a substrate side of the printing stencil opposite the squeegee side.

What is essential in this context is that the printing stencil is formed as a planar printing stencil, having a substrate side and a squeegee side opposite the substrate side, and that each printing gap of the plurality of printing gaps has at least one print definition region adjacent to the printing side and at least one printing medium supply region adjacent to the squeegee side, the volume of the print definition region being smaller than the volume of the printing medium supply region, the printing medium supply region has an increasing gap width, preferably a strictly monotonically increasing gap width, in the direction of the squeegee side.

It is furthermore essential that the walls of the print definition region form a first opening angle which is smaller than a second opening angle formed by the walls of the printing medium supply region and/or that the print definition region has an increasing gap width, preferably a strictly monotonically increasing gap width, in the direction of the substrate side.

By way of the printing gaps in the printing stencil, the method according to the invention enables the formation of structures, especially straight-line structures made of printing medium, on the substrate. A printing medium is applied in the shape defined by the print definition region as a result of the print definition region.

The object set forth at the outset is also achieved by a use according to the invention of a printing stencil according to the invention for forming metallic conductor tracks on a photovoltaic solar cell, preferably on a front side of the photovoltaic solar cell facing the incident light.

The so-called LIDE (laser-induced deep etching) method is particularly suitable for the production of the printing stencil according to the invention. By way of this method, it is possible to manufacture the printing gaps and the defined opening angles as required by the stencil according to the invention. Such a method is described in WO 2018/162385 A1. In this case, it is particularly advantageous for the printing stencil to be formed from glass.

The scope of the invention includes the printing device being structurally embodied in a manner known per se and having, as known per se, movement units for moving the squeegee and supply units for supplying printing medium on the squeegee side.

The scope of the invention moreover includes the printing stencil having further printing gaps or cutouts with different structural configurations, in addition to the above-described plurality of printing gaps. In particular, the scope of the invention includes the provision of one or more printing gaps of greater width, in order to connect the contacting fingers created by means of the plurality of printing gaps by means of a connector, the so-called busbar.

The volume of the printing medium supply region is preferably delimited by the walls of the printing gap in the region of the printing medium supply region and by the squeegee side of the printing stencil, in particular the plane surface continuation of the squeegee side of the printing stencil. By preference, the volume is also delimited in the direction of the substrate side by the print definition region.

The volume of the print definition region is preferably delimited by the walls of the printing gap in the region of the print definition region and by the substrate side of the printing stencil, in particular the plane surface continuation of the substrate side of the printing stencil. By preference, the volume is also delimited in the direction of the squeegee side by the printing medium supply region.

The plurality of printing gaps of the printing stencil according to the invention preferably total at least 5, particularly preferably at least 10, and further preferably at least 15 printing gaps.

BRIEF DESCRIPTION OF THE DRAWINGS

Further preferred features and embodiments are explained below on the basis of exemplary embodiments and figures. In this context, FIGS. 1 and 2 each show an exemplary embodiment of a printing gap of the printing stencil according to the invention.

DETAILED DESCRIPTION

The figures show schematic illustrations which are not true to scale. Identical reference signs in the figures designate identical or identically acting elements.

Figure 1:
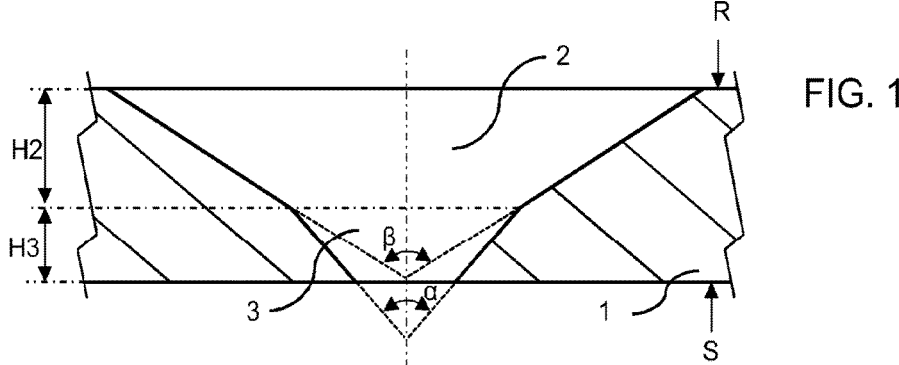

The exemplary embodiment of a printing stencil according to the invention shown in FIG. 1 is shown in a cross-sectional view, with a detail of the printing stencil with a printing gap being depicted. The printing stencil continues to the right and left in the same way. Overall, the printing stencil in the present case has 19 printing gaps which are arranged in parallel and have the same geometry.

On a squeegee side R, located at the top in the figures, the planar printing stencil 1 has an opening with an opening angle β. On a substrate side S, located at the bottom in the figures, the printing stencil 1 has an opening with an opening angle α. The squeegee-side opening angle β is greater than the substrate-side opening angle α. Both opening angles are oriented in the same sense.

In this exemplary embodiment, a printing medium supply region 2 is formed by way of a volume that is delimited by the squeegee-side printing stencil top side and the opening flanks of the channel walls of the opening defined by the opening angle β.

In this exemplary embodiment, a print definition region 3 is formed by way of a volume that is delimited by the substrate-side printing stencil bottom side S and the opening flanks of the printing gap opening defined by the opening angle α.

The printing medium supply region 2 thus terminates directly at the squeegee side. By contrast, the print definition region 3 terminates directly at the substrate side.

In this arrangement, the printing medium supply region and the print definition region are adjacent to one another. In this exemplary embodiment, the printing medium supply region height H2 is chosen to be higher than the print definition region height H3. Furthermore, the volume of the printing medium supply region 2 is greater than the volume of the print definition region 3; this promotes the ability to feed sufficient amounts of printing medium.

Figure 2:
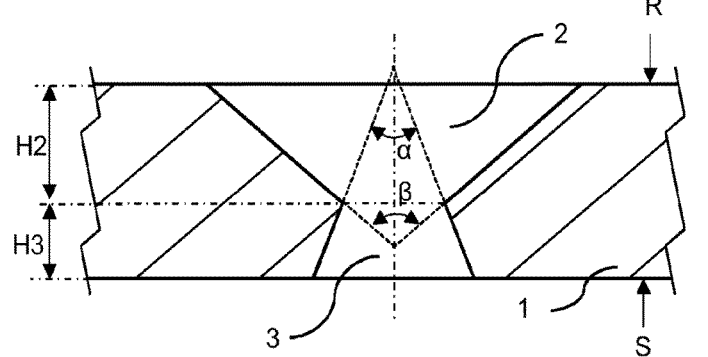

The exemplary embodiment of a printing stencil according to the invention shown in FIG. 2 is shown in a cross-sectional view, with a detail of the printing stencil with a printing gap being depicted. The printing stencil continues to the right and left in the same way. Overall, the printing stencil in the present case has 19 printing gaps which are arranged in parallel and have the same geometry.

On a squeegee side R, located at the top in the figures, the planar printing stencil 1 has an opening with an opening angle β. On a substrate side S, located at the bottom in the figures, the printing stencil 1 has an opening with an opening angle α. The squeegee-side opening angle β is greater than the substrate-side opening angle α. The two opening angles are oriented in opposite senses. As a result, the two regions form an hourglass shape.

In this exemplary embodiment, a printing medium supply region 2 is formed by way of a volume that is delimited by the squeegee-side printing stencil top side and the opening flanks of the channel walls of the opening defined by the opening angle β.

In this exemplary embodiment, a print definition region 3 is formed by way of a volume that is delimited by the substrate-side printing stencil bottom side S and the opening flanks of the printing gap opening defined by the opening angle α.

The printing medium supply region 2 thus terminates directly at the squeegee side. By contrast, the print definition region 3 terminates directly at the substrate side.

In this arrangement, the printing medium supply region 2 and the print definition region 3 are adjacent to one another. In this exemplary embodiment, the printing medium supply region height H2 is chosen to be higher than the print definition region height H3. Furthermore, the volume of the printing medium supply region 2 is greater than the volume of the print definition region 3; this promotes the ability to feed sufficient amounts of printing medium.

Figure 3:
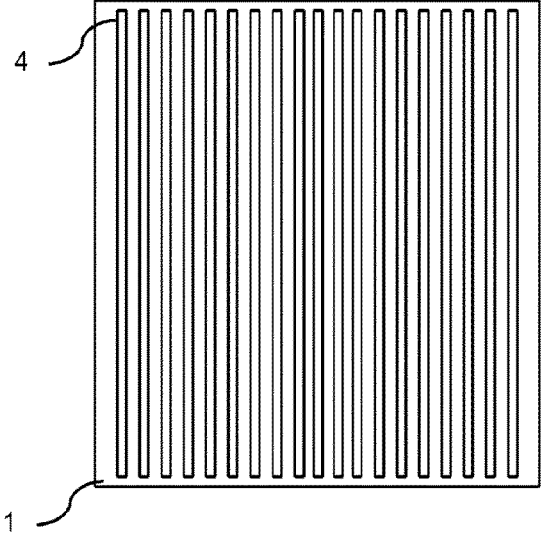
FIG. 3 shows an exemplary embodiment of a printing stencil according to the invention.

FIG. 3 shows an exemplary embodiment of a printing stencil 1 according to the invention in a plan view. The printing stencil 1 has a square embodiment, and the present printing stencil has 19 printing gaps which are arranged in parallel and have the same geometry. In this embodiment, the printing gaps 4 are arranged parallel to one another and parallel to an edge of the printing stencil 2. As a result of the printing gaps 4, it is possible to create straight-line structures of printing medium on the substrate. These structures represent metallic contacting elements.

The plan view shown in FIG. 3 also corresponds to the plan view of the exemplary embodiments shown in FIGS. 1 and 2.

Figure 4:
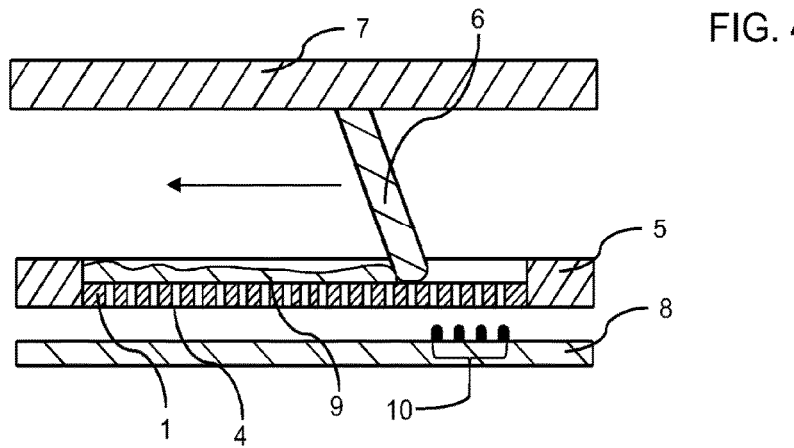
FIG. 4 shows an exemplary embodiment of a printing device according to the invention.

FIG. 4 schematically illustrates an exemplary embodiment of a printing device according to the invention. The printing device comprises a printing plate formed by a printing stencil 1 according to the exemplary embodiment shown in FIG. 1 and a frame 5. The printing stencil 1 is arranged in the frame 5. The printing plate with the printing stencil 1 and frame 5 thus represents an exemplary embodiment of a printing plate according to the invention which has no carrier structures, in particular no screen printing fabric, at the openings of the printing gaps 4.

Above the printing plate, a squeegee 6 is arranged on a movement unit 7. The movement unit 7 and the frame 5 are arranged on a mount (not depicted here) of the printing device, which also has a support for a substrate 8. The substrate 8 represents a precursor of a silicon solar cell, to which metallic contacting fingers 10 should be applied. A printing medium supply unit (likewise not depicted here) of the printing device is used to apply a metal particle-containing printing paste 9 to the squeegee side of the printing stencil 1 located at the top.

The movement unit 7 is used to move the squeegee 6 over the printing stencil 1 and the printing paste 9 is forced onto the substrate 8 through the printing gaps 4 of the printing stencil 1 as a result, and so printing paste in the form of thin, straight-line contacting fingers 10 arranged in parallel is applied to the substrate 8.

FIG. 4 shows a schematic illustration. In a real embodiment, the printing stencil 1 in the region of the squeegee 6 typically has a slight bend in the direction of the substrate 8.

LIST OF REFERENCE SIGNS

1 Printing stencil
2 Printing medium supply region
3 Print definition region
4 Printing gap
5 Frame
6 Squeegee
7 Movement unit
8 Substrate
9 Printing paste
10 Contact finger
R Squeegee side
S Substrate side
α, β Opening angle

The invention claimed is:

1. A printing stencil (1) for forming conductor tracks on a substrate, the printing stencil (1) comprising:
   a planar stencil body having a plurality of cutouts that form printing gaps (4) for forming the conductor tracks on the substrate,
   the planar material having a substrate side (S) and a squeegee side (R) opposite the substrate side (S), each printing gap (4) of the plurality of printing gaps (4) has at least one print definition region (3) adjacent to the printing side and at least one printing medium supply region (2) adjacent to the squeegee side (R), a volume of the print definition region (3) being smaller than a volume of the printing medium supply region (2), the volume of the print medium supply region (2) has a squeegee side surface area that is not internally limited by a structure, the printing medium supply region (2) has an increasing gap width in a direction of the squeegee side (R), and at least one of a) walls of the print definition region (3) form a first opening angle (α) which is smaller than a second opening angle (β) formed by walls of the printing medium supply region (2), or b) the print definition region (3) has an increasing gap width in a direction of the substrate side(S).

2. The printing stencil (1) as claimed in claim 1, wherein the walls of the print definition region (3) form the opening angle (α) that is smaller than the second opening angle formed by the walls of the printing medium supply region (2) by 10° or more.

3. The printing stencil (1) as claimed in claim 1, wherein the printing stencil has a thickness of 50 µm or more.

4. The printing stencil (1) as claimed in claim 1, wherein the print definition region (3) has a thickness of less than 250 µm.

5. The printing stencil (1) as claimed in claim 1, wherein the stencil body is formed of one of the materials of glass, stainless steel, or silicon.

6. The printing stencil (1) as claimed claim 1, wherein the width of each said printing gap (4) of the plurality of printing gaps (4) is less than 50 µm at an end of the print definition region (3) nearest to the squeegee side (R).

7. The printing stencil (1) as claimed in claim 1, wherein the width of each said printing gap (4) of the plurality of printing gaps (4) is less than 50 µm at an end of the print definition region (3) nearest to the substrate side(S).

8. The printing stencil (1) as claimed in claim 1, wherein the width of each said printing gap (4) of the plurality of printing gaps (4) is greater than 15 µm at an end of the printing medium supply region (2) nearest to the squeegee side (R).

9. The printing stencil (1) as claimed in claim 1, wherein the printing medium supply region (2) terminates directly at the squeegee side (R), and the print definition region (3) terminates directly at the substrate side(S).

10. The printing stencil (1) as claimed in claim 9, wherein the printing medium supply region (2) and print definition region (3) are adjacent to one another.

11. A printing plate, having the printing stencil (1) as claimed in claim 1, the printing stencil being arranged in a frame.

12. The printing plate as claimed in claim 11, wherein no carrier structures are formed on openings of the printing gaps (4).

13. A printing device for forming conductor tracks on a substrate, comprising the printing stencil (1) as claimed in claim 1 and at least one squeegee, the screen printing device being designed to apply printing medium through the screen printing plate onto the substrate via the squeegee.

14. A method for producing a metallic contact structure of a photovoltaic solar cell, the method comprising the following method steps:

applying printing medium to a squeegee side (R) of a printing stencil (1); and printing the printing medium through printing gaps (4) in the printing stencil (1) via at least one squeegee in order to apply a printing medium structure to a solar cell substrate on a substrate side(S) of the printing stencil opposite the squeegee side (R), the printing stencil (1) is formed as a planar printing stencil (1), having the substrate side(S) and the squeegee side (R) opposite the substrate side(S), and each printing gap (4) of the plurality of printing gaps (4) has at least one print definition region (3) adjacent to the printing side and at least one printing medium supply region (2) adjacent to the squeegee side (R), a volume of the print definition region (3) being smaller than a volume of the printing medium supply region (2), the volume of the print medium supply region (2) has a squeegee side surface area that is not internally limited by a structure, the printing medium supply region (2) has an increasing gap width in a direction of the squeegee side (R), and at least one of a) walls of the print definition region (3) form a first opening angle (α) which is smaller than a second opening angle (β) formed by walls of the printing medium supply region (2), or b) the print definition region (3) has an increasing gap width in a direction of the substrate side(S).

15. The method of claim 14, further comprising forming metallic conductor tracks of a photovoltaic solar cell.

16. The method of claim 15, wherein the metallic conductor tracks are formed on a front side of the photovoltaic solar cell facing the incident light.

\* \* \* \* \*